United States Patent [19]

Hara et al.

[11] Patent Number: 4,845,351

[45] Date of Patent: Jul. 4, 1989

[54] IC CARD

[75] Inventors: Kazuya Hara; Harumi Nakano; Shigeyuki Kawana, all of Tokyo, Japan

[73] Assignee: Casio Computer Co., Ltd., Tokyo, Japan

[21] Appl. No.: 909,217

[22] Filed: Sep. 18, 1986

[30] Foreign Application Priority Data

Sep. 30, 1985 [JP] Japan ............................ 60-216743
Oct. 23, 1985 [JP] Japan ............................ 60-237134

[51] Int. Cl.⁴ .................................................. G06K 19/06
[52] U.S. Cl. ............................................. 235/492; 235/438; 235/487
[58] Field of Search ........................ 235/487, 492, 438

[56] References Cited

U.S. PATENT DOCUMENTS

| | | | |
|---|---|---|---|
| 3,971,916 | 7/1976 | Moreno | 235/61.7 B |
| 4,105,156 | 8/1978 | Dethloff | 235/487 X |
| 4,446,475 | 5/1984 | Gercekci et al. | 235/487 X |
| 4,572,946 | 2/1986 | Schrenk | 235/492 X |
| 4,650,975 | 3/1987 | Kitchener | 235/492 X |
| 4,697,073 | 9/1987 | Hara | 235/487 |

FOREIGN PATENT DOCUMENTS 0172108 2/1986 European Pat. Off. ............ 235/492
8300244 1/1983 PCT Int'l Appl. .

OTHER PUBLICATIONS

IEEE Spectrum, vol. 21, No. 2, Feb. 1984; pp. 43–49.

Primary Examiner—Patrick R. Salce
Assistant Examiner—Marc S. Hoff
Attorney, Agent, or Firm—Frishauf, Holtz, Goodman & Woodward

[57] ABSTRACT

An IC including an EEP-ROM is formed on a semiconductor wafer. The IC also has exposed address pads connected to the address bus of the EEP-ROM, and exposed data pads connected to the data bus of the EEP-ROM. A test probe is brought into contact with these pads, thereby performing various tests on the IC. After the IC has been tested, the wafer is diced into IC pellets. The address pads are disconnected from the address bus and/or the data pads are disconnected from the data bus. For example, the edge portions of the IC pellet on which the address pads and/or the data pads are formed are cut by dicing from the remaining portion of the IC pellet. Thereafter, the connecting pads of the IC pellet are wire-bonded to leads, and the IC pellet is sealed with a resin. Finally, the sealed IC pellet is built in an IC card body.

5 Claims, 6 Drawing Sheets

IC CARD

BACKGROUND OF THE INVENTION

The present invention relates to an IC (Integrated Circuit) card, and more particularly to an IC card from which internal data including secret data cannot be illegally read.

Recent years have been called "the cashless era." Many things can be bought by using personal identification (ID) cards issued by credit companies and the like, eliminating the need to pay in cash.

Various kinds of ID cards are available at present, such as plastic cards, embossed cards, and cards with a magnetic stripe. From a structural point of view, these cards are easy to forge. Further, the data recorded on them can be easily read. Many cases of their illegal use have been reported, and this has become a great social problem.

To resolve this problem, IC cards with a built-in CPU and a built-in IC memory have been developed. The IC memory stores various data about the card owner, such as his or her personal identification number. The data cannot be easily read from the IC memory. Recently, an IC card system comprising such IC cards and terminals has been put to practical use.

Figure 1:
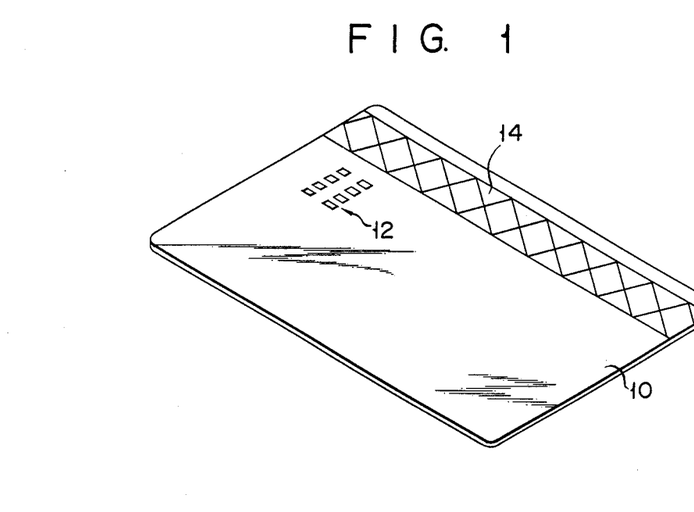
FIG. 1 is a perspective view of an IC card.

FIG. 1 is a perspective view of an IC card. As shown in this figure, eight connection pads 12 are arranged on plastic card body 10, in two vertical rows, each consisting of four pads. When the IC card is inserted in a terminal, connection pads 12 contact the corresponding pins provided in the terminal, thereby electrically connecting the IC card to the terminal. Of these eight pads, only six are actually used at present. Magnetic stripe 14 is adhered to the surface of card body 10.

Figure 2:
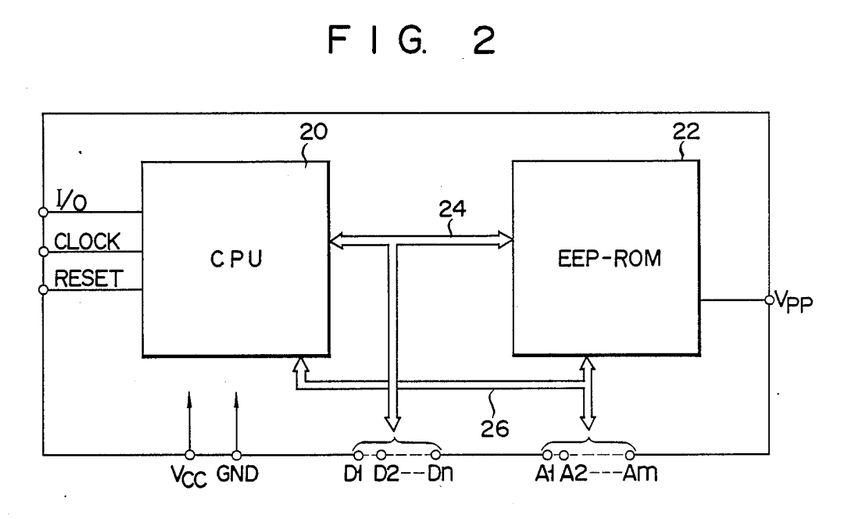
FIG. 2 shows the internal circuit of the IC card shown in FIG. 1.

An integrated circuit (IC) of the structure shown in FIG. 2 is formed within card body 10. This IC comprises CPU (Central Processing Unit) 20 and EEP-ROM (Electrically Erasable Programmable—Read Only Memory) 22. The six connection pads, i.e., input-/output terminal I/O, clock terminal CLOCK, reset terminal RESET, power supply terminal Vcc, ground terminal GND and data-writing power supply terminal Vpp, are provided in the IC. Due to its specific use, the IC must be greatly reliable. Therefore, it is subjected to an extremely strict test before delivery. EEP-ROM 22 is tested by inputting data to it, and outputting data from it, through input/output terminal I/O, bit by bit. Obviously, this method of testing EEP-ROM 22 requires too long a time. To save time, data pads D1 to Dn are coupled to n-bit data bus 24 connecting CPU 20 and EEP-ROM 22, and address pads A1 to Am are coupled to m-bit address bus 26 connecting CPU 20 and EEP-ROM 22. The test probe designed to test EEP-ROM 22 is put into contact with data pads D1 to Dn and address pads A1 to Am, whereby EEP-ROM 22 can be tested within a short time.

Figure 3:
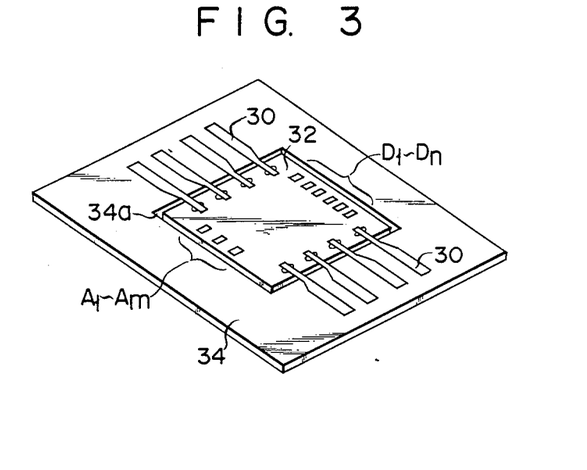
FIG. 3 is a diagram representing the connection between the IC pellet and base plate of a conventional IC card.

After EEP-ROM 22 has been tested, leads 30 are bonded to eight pads 12 as illustrated in FIG. 3, but no process is performed on data pads D1 to Dn or address pads A1 to Am. Thereafter, the IC is incorporated into card body 10. More precisely, IC pellet 32 containing the IC (FIG. 2) is put within recess 34a made in base plate 34 of card body 10, and is then so positioned to have eight pads 12 aligned with leads 30, respectively. Leads 30 are then bonded to pads 12.

If the IC card happens to fall into the hands of a person other than the card owner, either by theft or loss, and the IC is removed from card body 10, the data including secret data stored in EEP-ROM 22 can be read merely by touching a test probe to data pads D1 to Dn and address pads A1 to Am, which remain intact. In other words, the IC card can be forged based on the data thus read from EEP-ROM 22. This greatly reduces the security of the IC card. In the worst possible case, the technical aspects of the IC card system as a whole can be analyzed and unlawfully utilized on a large scale.

SUMMARY OF THE INVENTION

Accordingly, the object of this invention is to provide an IC card from which internal data cannot be illegally read, thereby maintaining the security of not only the card but also the system in which the card is used.

To achieve this object, according to the invention, there is provided an IC card comprising a memory for storing secret data, address terminals connected to the address line of the memory used to test the memory, data terminals coupled to the data line of the memory used to test the memory, and means for disconnecting at least one of the address terminals and the data terminals from the address line and from the data line, after the memory has been tested.

DETAILED DESCRIPTION OF THE PREFERRED EMBODIMENTS

The IC card according to a first embodiment of this invention will now be described with reference to the drawings attached hereto. First, it will be explained how the IC card, e.g., a credit card, is manufactured with reference to the flow chart of FIG. 4.

Figure 4:
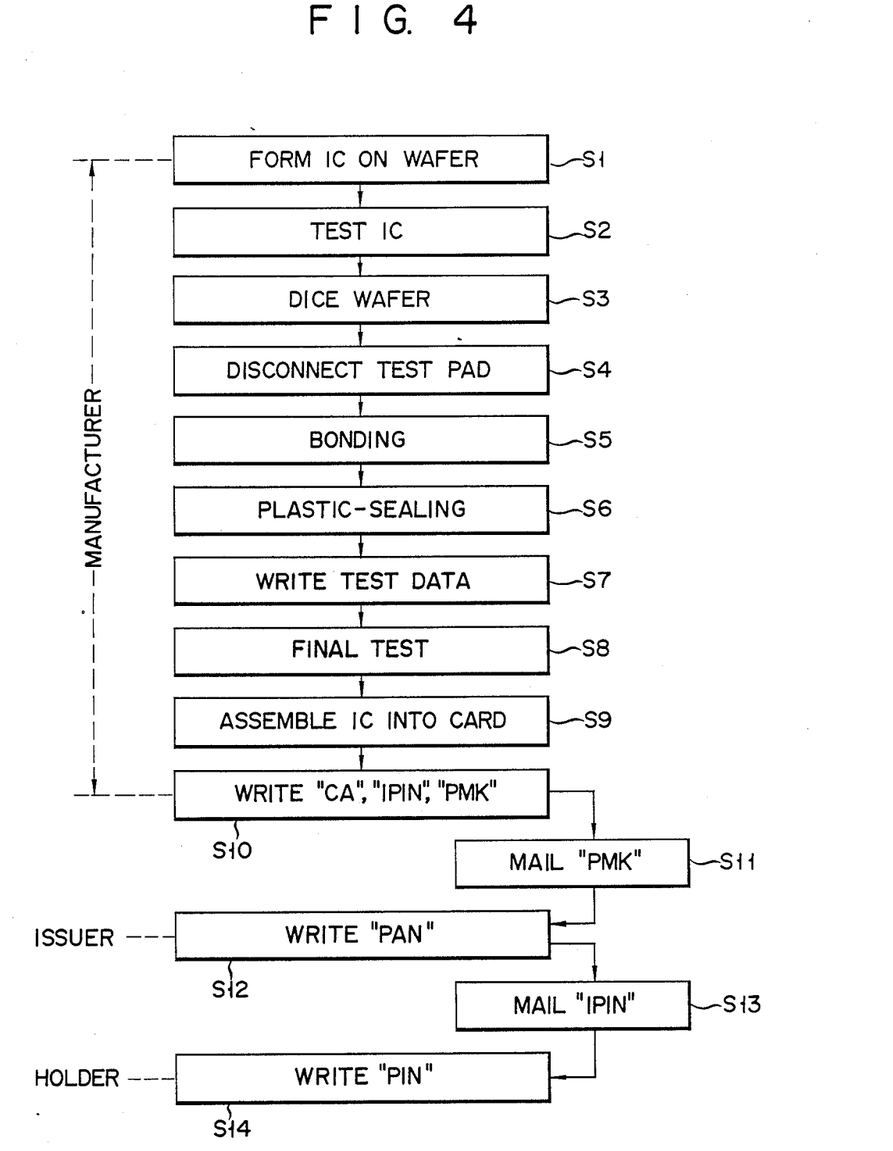
FIG. 4 is a flow chart explaining the process of manufacturing the IC card according to a first embodiment of the present invention.

To manufacture an IC card and bring it into a usable condition, a card manufacturer, a card issuer and a cardholder all take part in the process. In step S1, the card manufacturer forms an IC on a wafer. This IC is similar to the one shown in FIG. 2.

Figure 5:
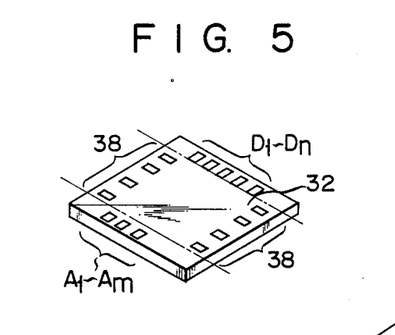
FIG. 5 is a perspective view of the IC pellet used in the IC card according to the first embodiment.

In step S2, the manufacturer tests the IC. To be more precise, a test probe is put into contact with the exposed data pads and address pads of the IC, thereby accomplishing various tests. (As described above, the data pads are coupled to the data bus connecting the CPU and EEP-ROM both included in the IC, and the address pads are coupled to the address bus connecting the CPU and EEP-ROM.) In the next step, step S3, the wafer is diced into a plurality of IC pellets. In step S4, the data pads and address pads, which are no longer necessary, are removed from each IC pellet, or disconnected from the data bus and address bus formed in the IC pellet. Now, only one terminal i.e., input/output terminal I/O, through which data in the EEP-ROM can be read out, is connected to the IC. This prevents an illegal access to the EEP-ROM. Data pads D1 to Dn and address pads A1 to Am are removed by cutting the opposing edge portions of IC pellet 32, on which data pads D1 to Dn and address pads A1 to Am are formed, along the one-dot-one-dash lines shown in FIG. 5. Eight connection pads 38, which will be electrically connected to pads 12 (FIG. 1), are formed on other opposing edge portions of IC pellet 32. IC pellet 32 can be cut to remove the data pads and address pads, by applying a laser beam or an etching solution to IC pellet 32.

Figure 6:
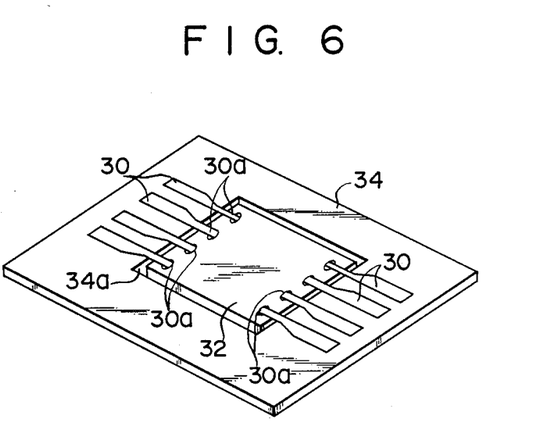
FIG. 6 is a diagram illustrating the connection between the IC pellet and base plate of the IC card according to the first embodiment.

Thereafter, in step S5, die-bonding is carried out to bond IC pellet 32 to base plate 34, and wire-bonding is performed to bond leads 30 to pads 38. More specifically, as shown in FIG. 6, IC pellet 32 is placed in recess 34a made in base plate 34 and is positioned to have pads 38 aligned with the ends (30a) of leads 30. IC pellet 32 is then die-bonded to base plate 34, and pins 38 of IC pellet 32 are connected to ends 30a of leads 30 by hot-pressing or pulse-heating process.

In the next step, step S6, a resin is applied onto the major surface of base plate 34, in which IC pellet 32 is now provided, thereby achieving the plastic-sealing of IC pellet 32. Then, test data is written in the test data area of the memory section of IC pellet 32, in step S7, through input/output terminal I/O. The test data is a minimal amount of data that is required for the fundamental operation of the IC card.

Then, in step S8, the IC pellet is subjected to the final test. Namely, basic tests on codes such as PIN (later described) are carried out.

Figure 7:
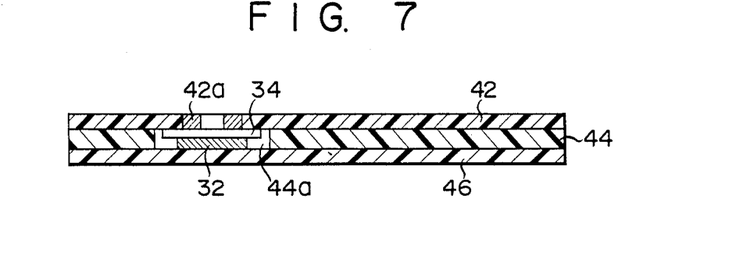
FIG. 7 is a cross-sectional view of the IC card according to the first embodiment.

In step S9, the unit consisting of IC pellet 32, base plate 34 and leads 30 is built in an IC card body. As shown in FIG. 7, the IC card body comprises upper sheet 42, intermediate sheet 44 and lower sheet 46, which are put one upon another and bonded together. To be more precise, intermediate sheet 44 made of hard PCV is bonded to lower sheet 46 made of soft PCV. Sheet 44 has an opening. This opening forms a recess 44a when sheet 44 and 46 are bonded. The base plate 34 is bonded to plate 40, forming an IC assembly. Upper sheet 42 made of soft PCV has eight through holes, arranged in two rows, each row consisting of four holes. Eight contacts 42a are formed in these holes. The IC assembly is positioned within recess 44a such that the IC unit contacts lower sheet 46. Then, upper sheet 42 is bonded to intermediate sheet 44, such that contacts 42a are connected to base plate 34. As a result, the IC card body is formed. A magnetic stripe (not shown in FIG. 7) is bonded on upper sheet 42. As a result, an IC card is manufactured. This IC card has the same outer appearance as the conventional IC card shown in FIG. 1.

Thereafter, in step S10, the card manufacturer inserts the IC card into a manufacturer's card terminal, and operates the manufacturer's card terminal, thereby writing codes CA (Card Authenticator), IPIN (Initialization Personal Identification Number), PMK (Production Master Key) and PRK (Private Key) into EEP-ROM 22. Code CA will be used to encrypt and decrypt messages. Code IPIN is a 6-bit code which remains valid until code PIN (Personal Identification Number) is written into EEP-ROM 22. Code PMK represents the number assigned to IC cards of the same lot. Code PRK will be used to decrypt an encrypted message.

After codes CA, IPIN, PMK and PRK have been written into EEP-ROM 22, the manufacturer's card terminal prints code PMK on a sheet of paper. In step S11, the card manufacturer mails the IC card and the PMK-printed paper to the card issuer under separate cover. Here, the card manufacturer has finished all work required of him.

The card issuer inserts the IC card into an issuer's card terminal, and operates the issuer's card terminal, thereby inputting code PAN representing the primary account number assigned to the cardholder, and also inputting code PMK printed the sheet of paper mailed from the card manufacturer. Code PAN is written into EEP-ROM 22 only when code PMK is identical with code PMK written in EEP-ROM 22 is step S12. When code PAN is written into EEP-ROM 22, the issuer's card terminal reads code IPIN from EEP-ROM 22 and prints this code on a sheet of paper. In step S13, the card issuer mails the IC card and the IPIN-printed paper to the cardholder.

The cardholder takes the IC card and the IPIN-printed paper to the card issuer's office. In step S14, the cardholder inserts the IC card in the card terminal installed in the card issuer's office, and then operates the card terminal, thereby inputting his or her personal identification number (PIN) and also code IPIN printed on the paper mailed from the card issuer. Code PIN is written into EEP-ROM 22 only when code IPIN is identical with code IPIN already written in EEP-ROM 22. After code PIN has been thus written into EEP-ROM 22, the IC card can be used.

In the first embodiment of this invention, before delivery the data pads and address pads are removed from the IC pellet after the IC chip has been tested. Therefore, if the IC card containing this IC pellet chances to fall into the hands of anyone other than the card-holder by theft or loss, and if the IC pellet is removed from the IC card, the data stored in EEP-ROM 22 can by no means be read. This prevents a forgery of the IC card, and ultimately maintains not only the security of the IC card, but also the security of the IC card system. All the test pads need not be removed after the test of the IC pellet. For instance, it suffices to remove only the data pads, only the address pads or only some of the data pads or the address pads.

Figure 8:
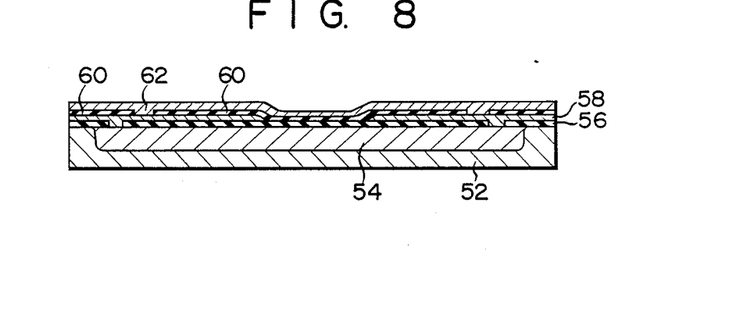
FIG. 8 is a cross-sectional view of the IC card which is a modification of the first embodiment.

A modification of the first embodiment will now be described. In the first embodiment, pads 38 are wire-bonded to leads 30 in step S5. Without such wire-bonding, pads 38 can be connected to leads 30 as in the modification (i.e., an IC pellet) shown in FIG. 8. As illustrated in FIG. 8, which is a cross-sectional view, this IC pellet comprises silicon substrate 52, active region 54 formed in the surface of substrate 52, insulation layer 56 formed on the surface of substrate 52 and having contact holes, inner contact pad 58 formed on insulation layer 56 and electrically connected to active region 54 through the contact holes of insulation layer 56, insulation layer 60 formed on inner contact pad 58 and having contact holes, and outer contact pad 62 formed on insulation layer 60 and electrically connected to inner contact pad 58 through the contact holes of insulation layer 60. This IC pellet (FIG. 8) is adhered to a base plate with an anisotropically conductive adhesive. The unit consisting of the IC pellet and base plate is incorporated into an IC card body, thereby forming an IC card. The anisotropically conductive adhesive consists of a hot-melt insulative adhesive and electrically conductive particles of nickel, silver or carbon, dispersed within the adhesive. It allows the passage of an electric current only in the direction in which it is compressed by hot-pressing. When outer contact pad 62 is extremely narrow, no conductive particles contained in the anisotropically conductive adhesive can contact pad 62. If this is the case, no electrical connection is accomplished between the IC pellet (FIG. 8) and the base plate. Therefore, in the modification of FIG. 8, outer contact pad 62 is broad enough to ensure the electrical connection between the IC pellet and the base plate. Since no wire-bonding is required in connecting the IC pellet to the base plate, the IC pellet can be efficiently connected to the base plate.

A second embodiment of the present invention will now be described with reference to the circuit diagram of FIG. 9, which shows the internal circuit of the IC card of the second embodiment.

Figure 9:
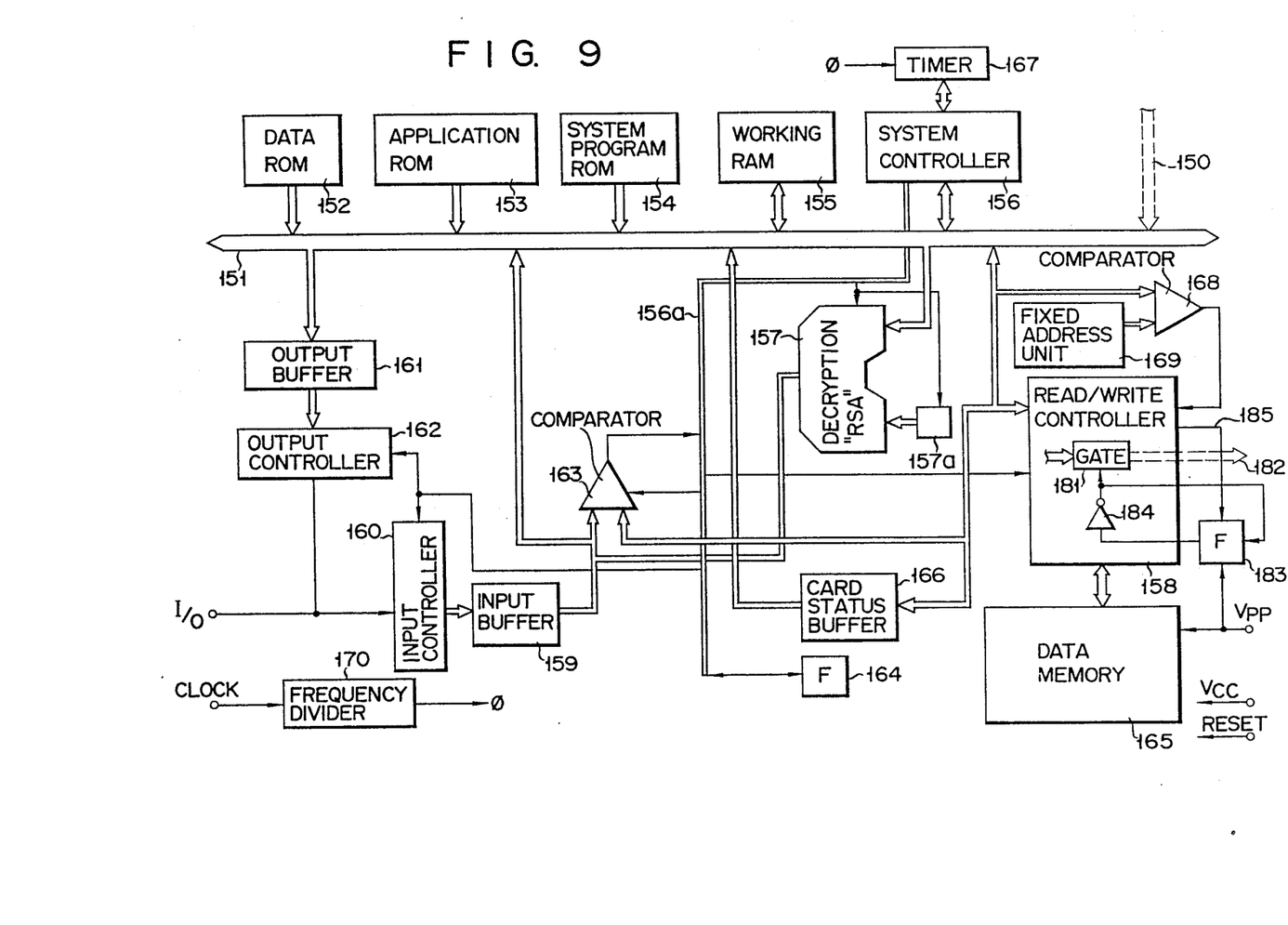
FIG. 9 shows the internal circuit of the IC card according to a second embodiment of this invention.

As shown in FIG. 9, the internal circuit comprises system bus 151. Data ROM 152, application ROM 153, system program ROM 154, working RAM 155, system controller 156, decryption unit 157, and read/write controller 158 are coupled to system bus 151. Input buffer 159 is connected to system bus 151, and input controller 160 is coupled to input buffer 159. Output buffer 161 is connected to system bus 151, and output controller 162 is connected to output buffer 161. Data input/output terminal I/O is connected to input controller 160 and also to output controller 162.

Data ROM 152 stores data representing all operation conditions of the IC cards, such as data-writing voltage, current tolerance, maximum application time, maximum data transmission capacity, and maximum response-waiting time. When the IC card is initialized, the condition data is supplied as "answer-to-reset" data to a card terminal (not shown) in conformance with a preset format. Application ROM 153 stores code APN (Application Name) showing the classification of the IC card. Code APN is put into a specified format and then supplied to the card terminal when an attribute exchange takes place in the card terminal after initial parameters have been set in the card terminal in accordance with the answer-to-reset data. System program ROM 154 stores codes ACK (acknowledgment) and NAC (nonaknowledgment), as well as every kind of system program. Code ACK indicates that the signal transmitted from the card terminal to the IC card is correct, and code NAC shows that this signal is incorrect. System controller 156 has an internal decision area. Controller 156 outputs commands to the associated components included in the internal circuit of the IC card, in accordance with the data supplied from input buffer 159 and in accordance with the operation status of the IC card. Decryption unit 157 decrypts the input data supplied from the card terminal through input buffer 159, in accordance with an RSA algorithm. It uses the decryption key code (the card issuer's private key) stored in key code memory 157a. Unit 157 outputs the decrypted data to comparator 163. The output data of comparator 163 is supplied to system controller 156 through system control line 156a. System control line 156a is connected to flag 164. Flag 164 is set or reset by the output data of comparator 163. Read/write controller 158 controls the data-writing and data-reading from data memory 165 in accordance with the command supplied from system controller 156. The data read from data memory 165 under the control of read/write controller 158 is input to comparator 163, system bus 151 or card status buffer 166. Read/write controller 158 has a tri-state gate 181. Tri-state gate 181 is connected on data line 182 to which the test data pads (not shown in FIG. 9) of the IC card is connected.

Flag-setting section 183 comprised of a one-bit memory is connected to read/write controller 158. The output of comparator 168 is coupled to a set terminal of flag-setting section 183 as a fetch signal. The output signal of flag-setting section 183 is supplied to inverter 184. The output of inverter 184 is supplied to the control terminal of tri-state gate 181 and also to the input terminal of flag-setting section 183.

Data memory 165 is, for example, an EEP-ROM. Secret codes CA, IPIN, PAN, CHN, EPD, PRK and RTN, and status data ST are written in this memory. Code CHN represents the cardholder's name, and code EPD shows the expiration data of the IC card. Code RTN indicates the number of times any incorrect data has been input to the IC card. Status data ST represents the present status of the IC card. More precisely, data ST shows whether the IC card has been completely manufactured, duly issued, or made usable by entering code PIN. Status data ST is in the same format as code APN (Application Name) stored in application ROM 153. Data ST is transmitted to the card terminal. Data memory 165 is not limited to an EEP-ROM; it can be comprised of an EP-ROM (Erasable Programmable—Read Only Memory), for instance.

System controller 156 is connected to timer 167. This timer 167 counts a predetermined period of time during the normal data exchange between the IC card and the card terminal, when a start data write voltage supply message is output by the card terminal. If a positive response code ACK is not supplied from the card terminal to the IC card during said period of time, system controller 156 stops the data exchange between the IC card and the card terminal.

Read/write controller 158 is connected to system bus 151 by a bus line. This bus line is coupled to one of the two input terminals of address comparator 168. Fixed address unit 169 is connected to the other input terminal of address comparator 168. Unit 169 stores a specific address of memory 165 that is not used. Address comparator 168 compares any address supplied to it via system bus 151 with the address stored in fixed address unit 169. The output data of comparator 168 is supplied to read/write controller 158 and also to the set terminal of flag-setting section 183. When the two addresses compared by address comparator 168 are coincident, that is, when the card terminal has input an illegal address, read/write controller 158 clears all data stored in data memory 165, thereby preventing secret data from being read out of the card.

When the IC card is electrically coupled to the card terminal, a reset signal RESET and a system clock signal are supplied from the card terminal to the IC card through connection pads. Voltages Vcc and Vpp are applied from the card terminal to the IC card. Voltage Vcc is used to drive both the IC card and the card terminal, and voltage Vpp is used to write data into data memory 165. The card terminal starts applying these voltages to the IC card in response to the answer-to-reset data read from data ROM 152. The system clock signal supplied to the IC card is frequency-divided by frequency divider 170.

The data exchange between the IC card shown in FIG. 9 and the card terminal will now be explained. When the IC card is inserted into the card terminal and thus electrically connected thereto, the card terminal supplies an initialization signal to the IC card. In response to the initialization signal, system controller 156 reads the answer-to-reset data from data ROM 152. The answer-to-reset data is supplied to the card terminal through output buffer 161, output controller 162 and input/output terminal I/O.

If the answer-to-reset data is found to be correct, the card terminal sends an enquiry code (ENQ) to the IC card. Code ENQ is input to working RAM 155 through input-output terminal I/O, input controller 160 and input buffer 159. System controller 156 determines whether or not code ENQ has been correctly written into working RAM 155. If it determines that code ENQ has been correctly written, system controller 156 supplies code ACK to the card terminal through output buffer 161, output controller 162 and input/output terminal I/O. If system controller 156 determines that code ENQ has been incorrectly written, it supplies code NAC to the card terminal.

In response to code ACK, the card terminal sends terminal code TC representing the type of the card terminal to the IC card. In response to code NAC, the card terminal ejects the IC card, thereby electrically disconnecting the IC card from it.

When terminal code TC is supplied to the IC card, code APN (Application Name) showing the type of the IC card is read from application ROM 153 under the control of system controller 156. Code APN is temporarily latched in output buffer 161 and is then sent to the card terminal.

The card terminal determines, from code APN, whether or not the IC card is compatible with the card terminal. If the IC card is found to be compatible, the card terminal sends a command code to the IC card. Conversely, if the IC card is found to be incompatible, the card terminal ejects the IC card, thereby electrically disconnecting the IC card from it.

When the command code is supplied to the IC card, code PIN (Personal Identification Number) stored in the IC card is compared with code PIN input through the keyboard of the card terminal. If these compared codes are identical, data will be exchanged between the IC card and the card terminal, thereby enabling a financial transaction.

Figure 10:
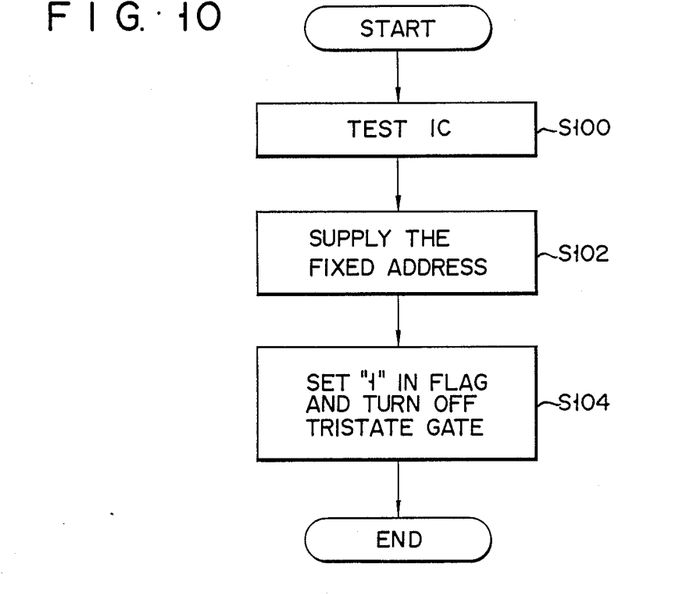
FIG. 10 is a flow chart explaining the process of manufacturing the IC card according to the second embodiment.

With reference to the flow chart of FIG. 10, it will be briefly explained how the IC card of the second embodiment is manufactured. First, in step S100, data memory 165 is tested for its function. More specifically, a test probe is put into contact with the data pads connected to data line 182 and the address pads connected to address line 150, as in the test of the IC pellet built in the IC card of the first embodiment. Since flag-setting section 183 is set to "0," the output of inverter 184 is "1." Tri-state gate 181 is therefore conductive. Hence, the data stored in those addresses of data memory 165 which have been designated by the signals supplied from the test probe through the address pads, address bus 150 and system bus 151, is read out to the data pads coupled to data bus 182, through tri-state gate 181 of read/write controller 158. Data memory 165 is thereby tested.

Upon completion of the test of data memory 165, the address data identical with the address stored in fixed address unit 169 is input to comparator 168 through system bus 151 in step S102. As a result, the output of comparator 168 becomes "1," whereby a signal for reading the output of inverter 184 is supplied to flag-setting section 183 through line 185 connecting comparator 168 to flag-setting section 183. Then, in step S104, the output of inverter 184, i.e., "1," is sent to flag-setting section 183. The output of inverter 184 therefore changes to "0," and tri-state gate 181 becomes non-conductive. Consequently, data line 182 is electrically cut, and the test data pads, which are coupled to this data bus 182, are electrically disconnected from data memory 165. Thereafter, the IC pellet is built in an IC card body, whereby the IC card of the second embodiment is completed.

If any person other than the cardholder receives this IC card by theft or by chance, he or she has no way to access to data memory 165 since the data pads have been disconnected from data bus 182. In short, an illegal reading of the data from data memory 165 can be prevented. This ensures not only the security of the IC card but also that of the IC card system as a whole.

Figure 11:
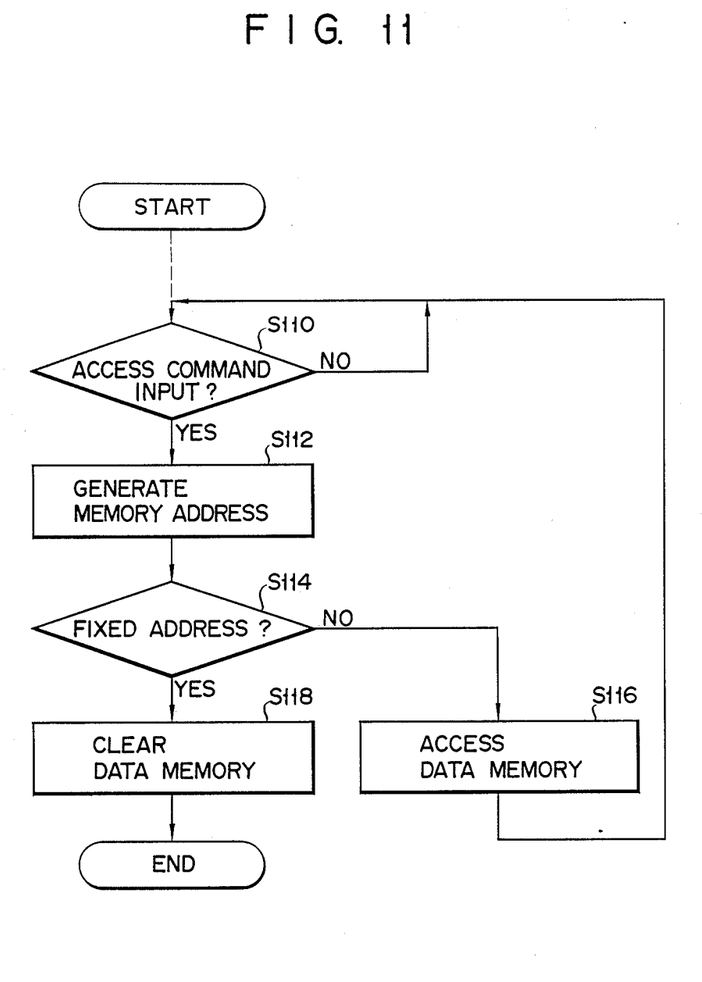
FIG. 11 is a flow chart explaining the operation of the IC card according to the second embodiment.

Furthermore, some security measures are taken during the use of the IC card, as will be explained with reference to the flow chart of FIG. 11. In step S110, it is determined whether or not a command for an access to data memory 165 has been supplied to the IC card. If YES, a data memory address is generated in step S112. In the next step, step S114, it is determined whether or not address comparator 168 has found that this address is identical with the address stored in fixed address unit 169. If NO in step S114, an access is made to data memory 165, in step S116. If YES in step S114, read/write controller 158 clears the data stored in data memory 165 in step S118. The two addresses compared by comparator 168 can be identical also when tri-state gate 181 is rendered non-conductive after the IC pellet has been tested. Nonetheless, when the data set in flag-setting section 183 is "0" and tri-state gate 181 is made conductive, the data stored in memory 165 is not cleared. Data memory 165 is cleared only when both the output of comparator 168 and the data set in flag-setting section 183 are "1."

All data stored in data memory 165 is cleared when the address set in fixed address unit 169 which is not provided in data memory 165 is supplied to the IC card. Therefore, the data cannot be illegally read from data memory 165.

In the second embodiment, tri-state gate 181 is used to electrically cut data bus 182, thereby electrically disconnecting the test data pads from data memory 165. Any other means, such as a gate or a switch, can be used for the same purpose. Further, tri-state gate 181 can be replaced by a fuse which is physically cut, thereby to permanently cut data bus 182. Still further, a tri-state gate can be connected on address line 150 and system bus 151 for electrically connecting or disconnecting the test address pads to or from data memory 165, either in place of, or in addition to, tri-state gate 181. Further, plural unused memory addresses may be stored in fixed address unit 169.

As described above, in the present invention, the data pads are disconnected from the data bus, or the address pads are cut from the address bus, after the IC pellet has been tested. Alternatively, all test pads are disconnected from the data line and address line after the test of the IC pellet. Therefore, an illegal access to the data memory provided within the IC card is prevented, ensuring not only the security of the IC card, but also that of the IC card system.

The present invention is not limited to the embodiments described above. Various changes and modifications can be made, without departing from the spirit of this invention.

What is claimed is:

1. An integrated circuit (IC) card, comprising:

data input/output terminal means;

memory means for storing secret data when inputted to said memory means through said data input/output terminal means, said memory means being arranged to output the secret data in response to an access command;

an address bus and a data bus each associated with said memory means;

identification means for identifying data inputted via said data input/output terminal means with the secret data stored in said memory means, and for generating a coincidence signal;

test address terminals connected to the address bus of said memory means, for enabling addresses of the memory means to be accessed during a test operation;

test data terminals arranged to be connected to the data bus of said memory means, for enabling inputting of data to and outputting of data from the memory means during said test operation;

detecting means for detecting a completion of the test operation for said memory means; and switching means coupled between said test data terminals and said data bus, for connecting said data bus with said test data terminals until said detecting means detects the completion of said test operation, and for disconnecting said data bus from said test data terminals when the completion of the test operation is detected;

wherein said memory means is non-responsive to said access command when the access command is applied to said test address terminals and the secret data is thus unobtainable from said test data terminals, after completion of said test operation.

2. An IC card according to claim 1, in which said switching means comprises a flag section set upon completion of the test of said memory means, first gate means connecting said test address terminals to the address bus of the memory means and second gate means connecting said data terminals to the data bus of the memory means, and at least one of said first gate means and second gate means being turned off in accordance with the value of the output of the flag section.

3. An IC card according to claim 1, further comprising data clearing means for clearing the secret data stored in said memory means.

4. An IC card according to claim 3, in which said data-clearing means comprises an address memory for storing an unused address of said memory means, comparator means for comparing a memory address input to achieve an access to said memory means, with the unused memory address stored in said address memory, and means for clearing the data stored in said memory means, when the input address is found to be identical with the unused address.

5. A method of manufacturing an integrated circuit (IC) card, comprising the steps of:

providing integrated circuit means having memory means for storing secret data;

connecting data input/output means to the memory means;

connecting test address terminals to an address bus associated with the memory means;

arranging test data terminals for connection to a data bus associated with the memory means;

providing detecting means for detecting the completion of a test operation for the memory means;

connecting switching means between said data bus and said test data terminals;

detecting the completion of the test operation with the detecting means by using the test address terminals for said memory means;

disconnecting the data bus of the memory means from the test data terminals by turning off the switching means upon detecting the completion of the test operation;

arranging the integrated circuit means in casing means; and writing secret data in the memory means.

* * * * *

UNITED STATES PATENT AND TRADEMARK OFFICE
CERTIFICATE OF CORRECTION

PATENT NO. : 4,845,351

DATED : July 4, 1989

INVENTOR(S) : Nakano, et al

It is certified that error appears in the above-identified patent and that said Letters Patent is hereby corrected as shown below:

On the title page:

Under the heading "[75] Inventors" and in Item [19] of the title page;

Delete the name of "Kazuya Hara" as an inventor.

Item [19] should read --Nakano, et al.--

Signed and Sealed this

Eighth Day of May, 1990

Attest:

HARRY F. MANBECK, JR.

*Attesting Officer*      *Commissioner of Patents and Trademarks*